(12) United States Patent
Chiu et al.

(10) Patent No.: US 8,026,517 B2
(45) Date of Patent: Sep. 27, 2011

(54) SEMICONDUCTOR STRUCTURES

(75) Inventors: Kuo-Chuang Chiu, Hsinchu (TW);
Tzer-Shen Lin, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 616 days.

(21) Appl. No.: 12/118,606

(22) Filed: May 9, 2008

(65) Prior Publication Data

US 2008/0277662 A1 Nov. 13, 2008

Related U.S. Application Data

(60) Provisional application No. 60/917,194, filed on May 10, 2007.

(51) Int. Cl.
*H01L 29/04* (2006.01)
(52) U.S. Cl. ........................................................ 257/51
(58) Field of Classification Search ............... 257/51, 257/613, E29.297–E29.298, 262, 368–401, 257/9–39, 183–201, 120, 124, 127, 133, 257/146, 153, 175, E29.315, E21.403; 438/46, 438/47, 77, 84, 93–95, 102, 104, 188, 189, 438/285, 603–604
See application file for complete search history.

(56) References Cited

U.S. PATENT DOCUMENTS

| | | | |
|---|---|---|---|
| 7,420,226 B2 * | 9/2008 | Augustine et al. | 257/195 |
| 7,825,417 B2 * | 11/2010 | Sakai et al. | 257/79 |
| 7,829,909 B2 * | 11/2010 | Yoo | 257/99 |
| 7,892,902 B1 * | 2/2011 | Hudait et al. | 438/172 |
| 2003/0197170 A1 * | 10/2003 | Bader et al. | 257/14 |
| 2004/0256613 A1 * | 12/2004 | Oda et al. | 257/19 |
| 2005/0056824 A1 * | 3/2005 | Bergmann et al. | 257/14 |
| 2005/0151128 A1 * | 7/2005 | Augusto | 257/22 |
| 2005/0242365 A1 * | 11/2005 | Yoo | 257/103 |
| 2006/0255365 A1 * | 11/2006 | Ko et al. | 257/192 |
| 2006/0284247 A1 * | 12/2006 | Augustine et al. | 257/338 |
| 2007/0101932 A1 * | 5/2007 | Schowalter et al. | 117/952 |
| 2007/0267625 A1 * | 11/2007 | Wang et al. | 257/14 |
| 2008/0315255 A1 * | 12/2008 | Maa et al. | 257/190 |

* cited by examiner

*Primary Examiner* — Dao Nguyen
*Assistant Examiner* — Tram H Nguyen

(57) ABSTRACT

A semiconductor structure is disclosed. The semiconductor structure includes a polycrystal substrate, a first single crystal layer formed thereon and a second single crystal layer formed on the first single crystal layer. A variation of coefficients of thermal expansion (CTE) between the first single crystal layer and the polycrystal substrate is less than 25%. There is no lattice mismatch between the first single crystal layer and the polycrystal substrate.

7 Claims, 4 Drawing Sheets

SEMICONDUCTOR STRUCTURES

BACKGROUND OF THE INVENTION

1. Field of the Invention

The invention relates to a semiconductor structure, and more particularly to a composite polycrystal substrate for growth of a single crystal layer.

2. Description of the Related Art

Recently, there has been enormous interest in the growth of Group III nitrides, and particularly gallium nitride (GaN) thin films, Jpn. J. Appl. Phys. Vol. 34 (1995) pp. L 797-L 799. GaN, and related (Aluminum, Indium) N alloys are being utilized for the production of efficient optoelectronic devices, such as, light emitters and detectors spanning the spectral range of visible to deep ultra-violet (UV) light. The direct, wide bandgap and the chemical stability of Group III nitrides are very beneficial for high-temperature and high-power electronic devices, such as, hetero-junction bipolar and field effect transistors.

When GaN is directly grown on a sapphire substrate, the growth mode is three-dimensional due to the large lattice mismatch, the chemical dissimilarity, and the thermal expansion difference. The layer contains structural defects such as point defects, misfit dislocations, and stacking faults. These defects degrade the structural, morphological, and electronic properties of the film. In order to achieve high quality epitaxial growth, researchers have introduced a thin low-temperature grown AlN or GaN layer serving as a buffer layer. This layer provides nucleation sites for subsequent two-dimensional GaN growth at higher temperatures, see H. Amano, M. Kito, K. Hiramatsu, and I. Akasaki, Jpn. J. Appl. Phys. 28, L2112 (1989) and S. Nakamura, T. Mukai, M. Senoh, and N. Isawa, Jpn. J. Appl. Phys. 31, L139 (1992). Thus, control of buffer layer growth is the most important step in improving GaN layer properties. The effect of buffer layer thickness and growth temperature on GaN layer properties has been researched by G. S. Sudhir, Y. Peyrot, J. Kruger, Y. Kim, R. Klockenbrink, C. Kisielowski, M. D. Rubin and E. R. Weber, Mat. Res. Symp. Proc. 482, pp. 525-530 (1998); Y. Kim, R. Klockenbrink, C. Kisielowski, J. Kruger, D. Corlatan, Sudhir G. S., Y. Peyrot, Y. Cho, M. Rubin, and E. R. Weber, Mat. Res. Symp. Proc. 482, pp. 217-222 (1998); J. Kruger, Sudhir G. S., D. Corlatan, Y. Cho, Y. Kim, R. Klockenbrink, S. Rouvimov, Z. Liliental-Weber, C. Kisielowski, M. Rubin and E. R. Weber, and results published in Mat. Res. Symp. Proc. 482 pp. 447-452 (1998). Buffer layers for Group-III nitride growth has been discussed in Mohammad et al., "Progress and Prospects of Group-III Nitride Semiconductors", Prog. Quant. Electr. 1996, Vol. 20, No. 5/6 pp. 418-419, hereby incorporated by reference in its entirety. Various buffer materials are disclosed.

GaN and related alloys are of particular interest for light emitting thin films because of their ability to cover a wide spectral range. Because a crystalline substrate with a lattice parameter near that of GaN is not yet available, different growth techniques are desirable in order to limit defect density.

BRIEF SUMMARY OF THE INVENTION

One embodiment of the invention provides a semiconductor structure comprising a polycrystal substrate, a first single crystal layer formed thereon and a second single crystal layer formed on the first single crystal layer.

A variation of coefficients of thermal expansion (CTE) between the first single crystal layer and the polycrystal substrate is less than 25%. The first single crystal layer has no lattice mismatch with the polycrystal substrate. The first single crystal layer serves as a nucleation layer for growth of the second single crystal layer.

During single crystal growth, dislocation density is reduced due to the lattice match between the polycrystal substrate and the nucleation layer. Additionally, due to their similar coefficients of thermal expansion (CTE), residual stress between the polycrystal substrate and the nucleation layer is effectively reduced when cooling subsequent to a high temperature process. Other defects such as stacking faults are also eliminated. Thus, a thick, high-purity single crystal layer is obtained.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawing, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
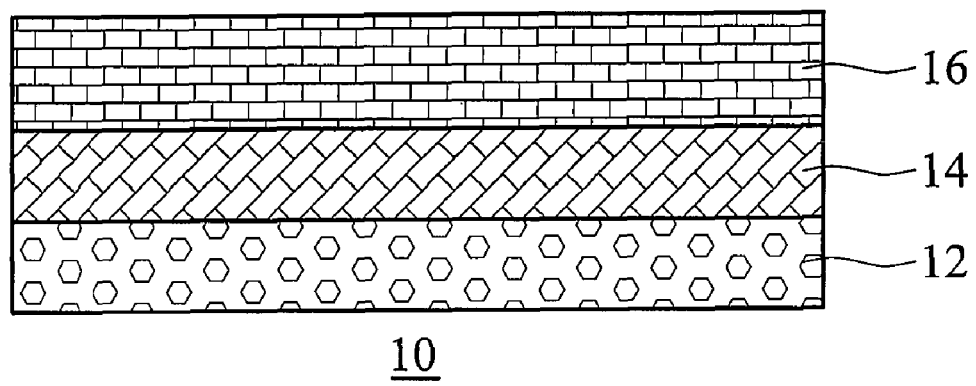
FIG. 1 shows a semiconductor structure of the invention.

According to one embodiment of the invention, a semiconductor structure is shown in FIG. 1. The semiconductor structure 10 comprises a polycrystal substrate 12, a first single crystal layer 14 and a second single crystal layer 16. The first single crystal layer 14 is formed on the polycrystal substrate 12. The second single crystal layer 16 is formed on the first single crystal layer 14.

The polycrystal substrate 12 may comprise gallium nitride, gallium oxide, aluminum oxide or silicon carbide, serving as an epitaxy substrate. The polycrystal substrate 12 may endure a process temperature exceeding 900° C. The first single crystal layer 14 may comprise gallium nitride, gallium oxide, aluminum oxide or silicon carbide. There is no lattice mismatch between the polycrystal substrate 12 and the first single crystal layer 14. The first single crystal layer 14 and the polycrystal substrate 12 have coefficients of thermal expansion (CTE) of about $4.2$-$7.5 \times 10^{-6}$/K. A variation of the coefficients of thermal expansion (CTE) between the first single crystal layer 14 and the polycrystal substrate 12 is less than 25%. The first single crystal layer 14 serves as a nucleation layer for growth of the second single crystal layer 16 such as single crystal gallium nitride, gallium oxide, aluminum oxide or silicon carbide. The semiconductor structure 10 may further comprise a bonding layer (not shown) between the polycrystal substrate 12 and the first single crystal layer 14. The bonding layer may comprise metal.

The second single crystal layer 16 serves as a luminescent material and is applied in optoelectronic devices such as light emitters.

Figure 2A:
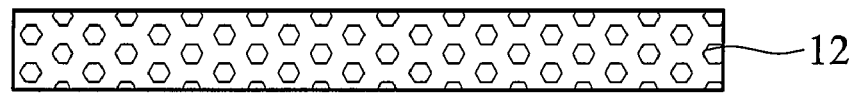
FIGS. 2A-2C shows a method for fabricating a semiconductor structure of the invention.
Figure 2B:
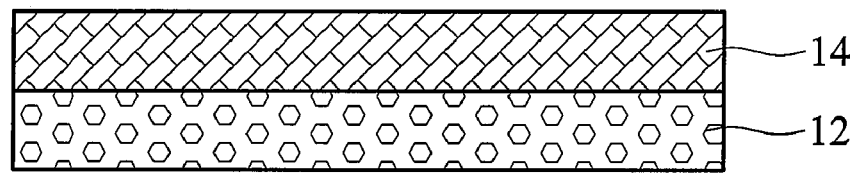
Figure 2C:
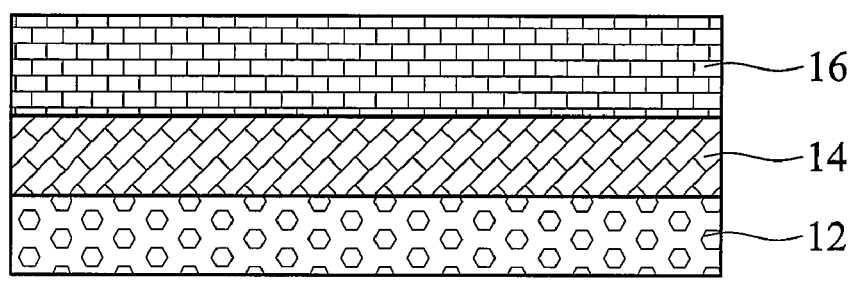

An embodiment of a method for fabricating the disclosed semiconductor structure of the invention is shown in FIGS. 2A-2C. Referring to FIG. 2A, a polycrystal substrate 12 such as gallium nitride, gallium oxide, aluminum oxide or silicon carbide is provided. In an embodiment, gallium oxide powders are first shaped into a gallium oxide ceramic substrate. After surface treatment such as CMP, the gallium oxide ceramic substrate is then sintered and densified in a nitrogen furnace under high temperature, for example, 1,500-1,800° C. and high pressure to form the polycrystal gallium nitride substrate 12.

Referring to FIG. 2B, a first single crystal layer 14 such as gallium nitride, gallium oxide, aluminum oxide or silicon carbide is formed on the polycrystal substrate 12. In some embodiments, the first single crystal layer 14 is cut away from a single crystal layer such as a single crystal gallium nitride, gallium oxide, aluminum oxide or silicon carbide layer by, for example, the smart cut technique, and then transferred to the polycrystal substrate 12. The first single crystal layer 14 may be directly bonded on the polycrystal substrate 12 or bonded on the polycrystal substrate 12 through a bonding layer (not shown). The first single crystal layer 14 serves as a nucleation layer for growth of a single crystal layer.

Referring to FIG. 2C, after surface treatment such as CMP, the second single crystal layer 16 such as single crystal gallium nitride, gallium oxide, aluminum oxide or silicon carbide is grown on the first single crystal layer 14 by, for example, a metal organic chemical vapor deposition (MOCVD) or molecular beam epitaxy (MBE) process, with a thickness exceeding at least 5 μm.

An embodiment of another method for fabricating the disclosed semiconductor structure of the invention is also shown in FIGS. 2A-2C. Referring to FIG. 2A, a polycrystal substrate 12 such as gallium nitride, gallium oxide, aluminum oxide or silicon carbide is provided. In an embodiment, gallium oxide powders are first shaped into a gallium oxide ceramic substrate. The surface of the gallium oxide ceramic substrate is then treated by such as CMP.

Referring to FIG. 2B, a first single crystal layer 14 such as gallium nitride, gallium oxide, aluminum oxide or silicon carbide is formed on the polycrystal substrate 12. In some embodiments, the first single crystal layer 14 is cut away from a single crystal layer such as a single crystal gallium nitride, gallium oxide, aluminum oxide or silicon carbide layer by, for example, the smart cut technique, and then transferred to the polycrystal substrate 12. The first single crystal layer 14 may be directly bonded on the polycrystal substrate 12 or bonded on the polycrystal substrate 12 through a bonding layer (not shown). The first single crystal layer 14 serves as a nucleation layer for growth of a single crystal layer.

Referring to FIG. 2C, after surface treatment such as CMP, the second single crystal layer 16 such as single crystal gallium nitride, gallium oxide, aluminum oxide or silicon carbide is grown on the first single crystal layer 14 by, for example, a metal organic chemical vapor deposition (MOCVD) or molecular beam epitaxy (MBE) process, with a thickness exceeding at least 5 μm.

During the single crystal (the second single crystal layer 16) growth, dislocation density is reduced due to lattice match between the polycrystal substrate (the polycrystal substrate 12) and the nucleation layer (the first single crystal layer 14). Additionally, due to their similar coefficients of thermal expansion (CTE), residual stress between the polycrystal substrate (the polycrystal substrate 12) and the nucleation layer (the first single crystal layer 14) is reduced when cooling down subsequent to a high temperature process. Other defects such as stacking faults are also eliminated. In accordance with the disclosed single crystal growth conditions, a high-purity single crystal (the second single crystal layer 16) with a thickness exceeding at least 5 μm is obtained.

Figure 3:
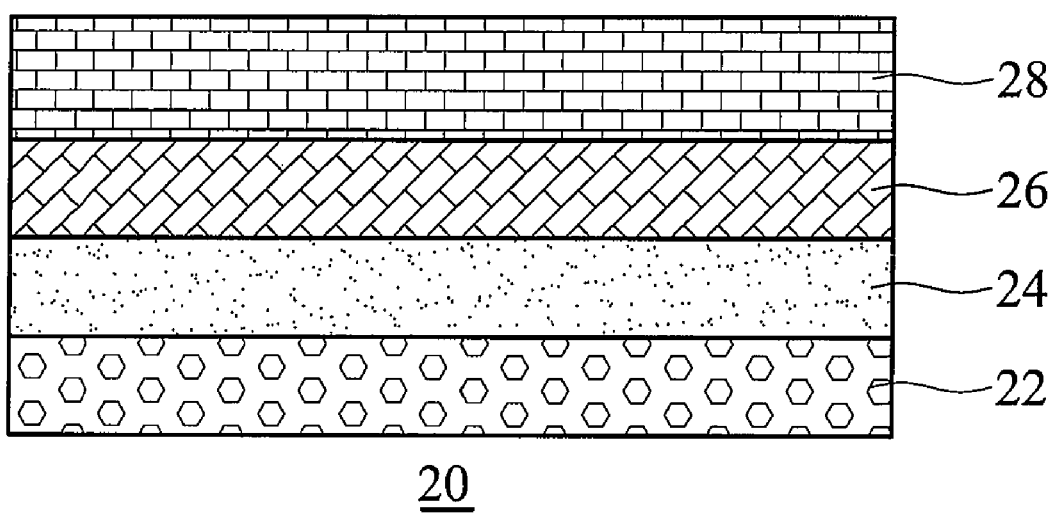
FIG. 3 shows another semiconductor structure of the invention.

According to one embodiment of the invention, another semiconductor structure is shown in FIG. 3. The semiconductor structure 20 comprises a polycrystal substrate 22, a polycrystal layer 24, a first single crystal layer 26 and a second single crystal layer 28. The polycrystal layer 24 is formed on the polycrystal substrate 22. The first single crystal layer 26 is formed on the polycrystal layer 24. The second single crystal layer 28 is formed on the first single crystal layer 26.

The polycrystal substrate 22 may comprise gallium nitride, gallium oxide, aluminum oxide or silicon carbide, serving as an epitaxy substrate. The polycrystal substrate 22 may endure a process temperature exceeding 900° C. The first single crystal layer 26 may comprise gallium nitride, gallium oxide, aluminum oxide or silicon carbide. There is no lattice mismatch between the polycrystal substrate 22 and the first single crystal layer 26. The first single crystal layer 26 and the polycrystal substrate 22 have coefficients of thermal expansion (CTE) of about $4.2$-$7.5 \times 10^{-6}$/K. A variation of the coefficients of thermal expansion (CTE) between the first single crystal layer 26 and the polycrystal substrate 22 is less than 25%. The first single crystal layer 26 serves as a nucleation layer for growth of the second single crystal layer 28 such as single crystal gallium nitride, gallium oxide, aluminum oxide or silicon carbide. The semiconductor structure 20 may further comprise a bonding layer (not shown) between the polycrystal substrate 22 and the first single crystal layer 26. The bonding layer may comprise metal.

The second single crystal layer 28 serves as a luminescent material and is applied in optoelectronic devices such as light emitters.

Figure 4A:
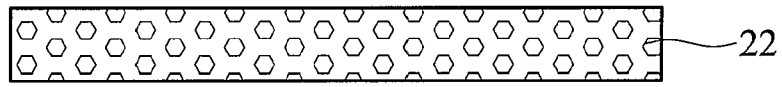
FIGS. 4A-4D shows a method for fabricating a semiconductor structure of the invention.
Figure 4B:
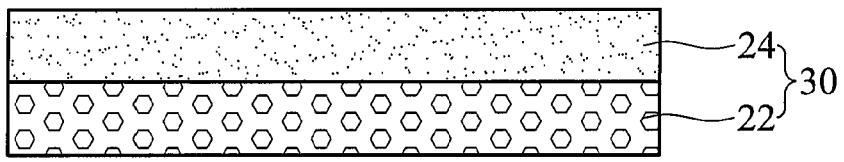

An embodiment of a method for fabricating the disclosed semiconductor structure is shown in FIGS. 4A-4D. Referring to FIG. 4A, a polycrystal substrate 22 such as gallium oxide, gallium oxide, aluminum oxide or silicon carbide is provided. In an embodiment, gallium oxide powders are first shaped into a gallium oxide ceramic substrate. After surface treatment such as CMP, the surface of the gallium oxide ceramic substrate is treated with nitrogen to form the polycrystal gallium nitride layer 24. Thus, a composite polycrystal substrate 30 comprising a bottom gallium oxide substrate 22 and an upper gallium nitride layer 24 of about 0.3-0.6 μm is formed, as shown in FIG. 4B.

Figure 4C:
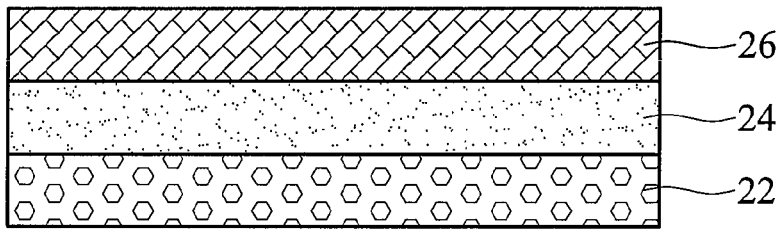

Referring to FIG. 4C, a first single crystal layer 26 such as gallium nitride, gallium oxide, aluminum oxide or silicon carbide is formed on the polycrystal layer 24. In some embodiments, the first single crystal layer 26 is cut away from a single crystal layer such as a single crystal gallium nitride, gallium oxide, aluminum oxide or silicon carbide layer by, for example, the smart cut technique and then transferred to the polycrystal layer 24. The first single crystal layer 26 may be directly bonded on the polycrystal layer 24 or bonded on the polycrystal layer 24 through a bonding layer (not shown). The first single crystal layer 26 serves as a nucleation layer for growth a single crystal layer.

Figure 4D:
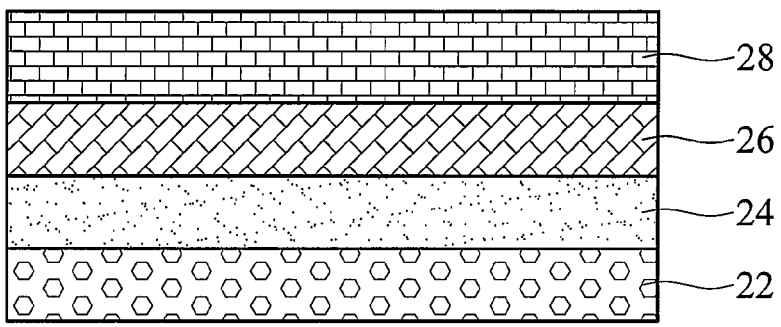

Referring to FIG. 4D, after surface treatment such as CMP, the second single crystal layer 28 such as single crystal gallium nitride, gallium oxide, aluminum oxide or silicon carbide is grown on the first single crystal layer 26 by, for example, a metal organic chemical vapor deposition (MOCVD) or molecular beam epitaxy (MBE) process, with a thickness exceeding at least 5 μm.

EXAMPLE 1

Preparation of Polycrystal Substrate I for Growth of Single Crystal Layer

First, gallium oxide powders were shaped into a gallium oxide ceramic substrate. After CMP, the gallium oxide ceramic substrate was sintered in a nitrogen furnace to form a polycrystal gallium nitride substrate.

Next, a first single crystal gallium nitride layer obtained by the smart cut technique was transferred to the polycrystal gallium nitride substrate. The first single crystal gallium nitride layer was directly bonded on the polycrystal gallium nitride substrate.

After CMP, a second single crystal gallium nitride layer was grown on the first single crystal gallium nitride layer by metal organic chemical vapor deposition (MOCVD) process.

EXAMPLE 2

Preparation of Polycrystal Substrate II for Growth of Single Crystal Layer

First, gallium oxide powders were shaped into a polycrystal gallium oxide ceramic substrate. After CMP, a first single crystal gallium nitride layer obtained by the smart cut technique was transferred to the polycrystal gallium oxide substrate. The first single crystal gallium nitride layer was directly bonded on the polycrystal gallium oxide substrate.

After CMP, a second single crystal gallium nitride layer was grown on the first single crystal gallium nitride layer by metal organic chemical vapor deposition (MOCVD) process.

EXAMPLE 3

Preparation of Polycrystal Substrate III for Growth of Single Crystal Layer

First, gallium oxide powders were shaped into a gallium oxide ceramic substrate. After CMP, the surface of the gallium oxide ceramic substrate was treated with nitrogen to form a polycrystal gallium nitride layer with 0.3 μm. A composite polycrystal substrate comprising the bottom gallium oxide substrate and the upper gallium nitride layer was formed.

Next, a first single crystal gallium nitride layer obtained by the smart cut technique was transferred to the composite polycrystal substrate, directly bonded on the gallium nitride layer.

After CMP, a second single crystal gallium nitride layer was grown on the first single crystal gallium nitride layer by metal organic chemical vapor deposition (MOCVD) process.

The properties of the polycrystal substrates of the invention and the conventional substrates are compared in Table 1.

TABLE 1

| Substrate materials | Crystal structure | Lattice constant a | Lattice constant c | coefficients of thermal expansion ($\times 10^{-6}$/K) | Lattice mismatch | Thermal mismatch |
|---|---|---|---|---|---|---|
| Single crystal GaN | Hexagonal | 3.189 | 5.16 | 5.59 | — | — |
| Polycrystal GaN | Hexagonal | — | — | 5.8 | — | −3% |
| Polycrystal $Ga_2O_3$ | Monoclinic | — | — | 6.24 | — | −11% |
| Sapphire $Al_2O_3$ | Hexagonal | 4.758 | 12.98 | 7.5 | 14 | −34% |
| 6H—SiC | Hexagonal | 3.08 | 15.12 | 4.2 | 3.5 | 25% |

In Table 1, the polycrystal substrates (polycrystal GaN and polycrystal $Ga_2O_3$) provided by the invention have less thermal mismatch (3% and 11%, respectively) with the single crystal nucleation layer formed thereon than the other conventional substrates (34% for sapphire $Al_2O_3$ substrate and 25% for 6H—SiC substrate) due to similar coefficients of thermal expansion (CTE) therebetween, facilitating subsequent growth of a thick and high-purity single crystal layer. Additionally, preparation of the polycrystal substrates is simpler and cheaper than the single crystal substrates, with fabrication advantage.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:

a polycrystal substrate;

a first single crystal layer directly formed on the polycrystal substrate; and a second single crystal layer formed on the first single crystal layer;

wherein a variation of coefficients of thermal expansion (CTE) between the first single crystal layer and the polycrystal substrate is less than 25%;

wherein the polycrystal substrate comprises gallium nitride, gallium oxide, aluminum oxide or silicon carbide.

2. The semiconductor structure as claimed in claim 1, wherein the first single crystal layer comprises gallium nitride, gallium oxide, aluminum oxide or silicon carbide.

3. The semiconductor structure as claimed in claim 1, wherein the first single crystal layer has no lattice mismatch with the polycrystal substrate.

4. The semiconductor structure as claimed in claim 1, wherein the second single crystal layer comprises gallium nitride, gallium oxide, aluminum oxide or silicon carbide.

5. The semiconductor structure as claimed in claim 1, wherein the second single crystal layer has a thickness exceeding at least 5 μm.

6. The semiconductor structure as claimed in claim 4, wherein the second single crystal layer serves as a luminescent material.

7. The semiconductor structure as claimed in claim 4, wherein the second single crystal layer is applied in optoelectronic devices.

* * * * *